(12) United States Patent
Tian et al.

(10) Patent No.: US 11,794,314 B2
(45) Date of Patent: Oct. 24, 2023

(54) QUICK SWAP CHUCK WITH VACUUM HOLDING INTERCHANGEABLE TOP PLATE

(71) Applicant: KLA Corporation, Milpitas, CA (US)

(72) Inventors: Lim Chow Tian, Singapore (SG); Rajeev Patil, Fremont, CA (US); Harit Maganlal Gadhia, Singapore (SG)

(73) Assignee: KLA Corporation, Milpitas, CA (US)

( * ) Notice: Subject to any disclaimer, the term of this patent is extended or adjusted under 35 U.S.C. 154(b) by 37 days.

(21) Appl. No.: 17/562,544

(22) Filed: Dec. 27, 2021

(65) Prior Publication Data

US 2023/0069384 A1 Mar. 2, 2023

Related U.S. Application Data

(60) Provisional application No. 63/238,222, filed on Aug. 30, 2021.

(51) Int. Cl.
*H01L 21/683* (2006.01)
*B25B 11/00* (2006.01)
*G01N 21/95* (2006.01)

(52) U.S. Cl.
CPC ........ *B25B 11/005* (2013.01); *G01N 21/9501* (2013.01); *H01L 21/6838* (2013.01)

(58) Field of Classification Search
CPC ........... H01L 21/6838; H01L 21/67092; H01L 21/68757; H01L 21/6875; H01L 21/68735;
(Continued)

(56) References Cited

U.S. PATENT DOCUMENTS 4,842,686 A 6/1989 Davis et al.
5,805,278 A 9/1998 Danko
(Continued)

FOREIGN PATENT DOCUMENTS

EP 2662728 A1 11/2013
EP 3087595 B1 8/2021
WO 2008121561 A1 10/2008

OTHER PUBLICATIONS

International Search Report and Written Opinion in International Application No. PCT/US2022/041793, dated Dec. 16, 2022, 7 pages.
(Continued)

*Primary Examiner* — Tyrone V Hall, Jr.
*Assistant Examiner* — Alberto Saenz
(74) *Attorney, Agent, or Firm* — Suiter Swantz pc llo (57) ABSTRACT

An apparatus for securing a substrate includes a detachable plate configured to reversibly attach to a base of a chuck. The base of the chuck includes one or more base-substrate vacuum inlet channels and one or more base-plate inlet channels. The detachable plate includes one or more first vacuum reservoirs and second vacuum reservoirs. The detachable plate is further configured to establish a fluidic connection between the one or more first vacuum reservoirs and the base-plate inlet channels for forming a first vacuum seal between the detachable plate and the base. The detachable plate further includes one or more pass-through channels for fluidic connection with the one or more second vacuum reservoirs for forming a second vacuum seal between the detachable plate and the substrate.

22 Claims, 5 Drawing Sheets

(58) Field of Classification Search
CPC . H01L 21/68785; B25B 11/00; B25B 11/005; B23Q 3/08; B23Q 3/088; G01N 21/9501; Y10T 279/11; B23B 31/307
USPC ............ 269/20, 21, 35, 289 R, 900; 29/559; 279/3
See application file for complete search history.

(56) References Cited

U.S. PATENT DOCUMENTS

| | | |
|---|---|---|
| 6,621,570 B1 | 9/2003 | Danko |
| 6,700,099 B2 | 3/2004 | Cole et al. |
| 6,702,302 B2 | 3/2004 | Smedt et al. |
| 6,739,958 B2 | 5/2004 | Chao et al. |
| 7,092,082 B1 | 8/2006 | Dardzinski |
| 7,665,717 B2 | 2/2010 | Lenzini |
| 7,694,700 B2 | 4/2010 | Bernard et al. |
| 9,117,869 B2 | 8/2015 | Kusunose |
| 9,397,250 B2 | 7/2016 | Moslehi et al. |
| 9,911,640 B2 | 3/2018 | Kesil et al. |
| 10,124,492 B2 | 11/2018 | Genetti et al. |
| 10,532,411 B2 * | 1/2020 | Yamamoto ............ H01L 21/682 |
| 2003/0213793 A1 | 11/2003 | Cole et al. |
| 2017/0345700 A1 | 11/2017 | Oremus |
| 2018/0005864 A1 | 1/2018 | Rudmann et al. |
| 2019/0094700 A1 | 3/2019 | Matsumoto |
| 2020/0395232 A1 | 12/2020 | Krupyshev et al. |
| 2021/0074575 A1 * | 3/2021 | Yamamoto ............. B23K 26/38 |

OTHER PUBLICATIONS

"Replaceable Vacuum Chuck Top Plate" Retrieved from https://www.todaysmedicaldevelopments.com/article/replaceable-vacuum-chuck-top-plate/.

* cited by examiner

QUICK SWAP CHUCK WITH VACUUM HOLDING INTERCHANGEABLE TOP PLATE

CROSS-REFERENCE TO RELATED APPLICATION

The present application claims the benefit under 35 U.S.C. § 119(e) of U.S. Provisional Application Ser. No. 63/238,222, filed Aug. 30, 2021, entitled QUICK SWAP CHUCK WITH VACUUM HOLDING INTERCHANGEABLE TOP PLATE, naming Lim Chow Tian, Rajeev Patil, and Harit Maganlal Gadhia as inventors, which is incorporated herein by reference in the entirety.

TECHNICAL FIELD

The present invention generally relates to a substrate chucking system and, more particularly, to a substrate chucking system with a vacuum-held, detachable top plate.

BACKGROUND

As tolerances on semiconductor device fabrication processes continue to narrow, the demand for improved optical systems for semiconductor wafer review continues to increase. In such an optical system, a substrate chuck may be used to secure a substrate in place. Traditionally, in order to review multiple shapes, sizes, and varieties of substrates, multiple substrate chucks have to be interchanged. The process of interchanging substrate chucks and properly calibrating multiple substrate chucks can often take a long period of time. Further, fabrication of multiple substrate chucks can be costly.

Therefore, it would be desirable to provide a system and method that cure the shortfalls of the previous approaches identified above.

SUMMARY

An apparatus for securing a substrate is disclosed, in accordance with one or more embodiments of the present disclosure. In one embodiment, the apparatus includes a detachable plate configured for reversible attachment to a base of a chuck. In another embodiment, the detachable plate includes one or more first vacuum reservoirs on a backside portion of the detachable plate and one or more second vacuum reservoirs on a frontside portion of the detachable plate. In another embodiment, the base includes one or more base-substrate vacuum inlet channels and one or more base-plate inlet channels. In another embodiment, the detachable plate is configured to establish fluidic connection between the one or more first vacuum reservoirs on the backside portion of the detachable plate and the one or more base-plate inlet channels for forming a first vacuum seal between the detachable plate and the base. In another embodiment, the detachable plate includes one or more pass-through channels for fluidic connection with the one or more base-substrate vacuum inlet channels to establish fluidic connection between the one or more second vacuum reservoirs on the frontside portion of the detachable plate for forming a second vacuum seal between the detachable plate and the substrate.

An apparatus for securing a substrate is disclosed, in accordance with one or more embodiments of the present disclosure. In one embodiment, the apparatus includes a base of a chuck. In another embodiment, the base includes one or more base-substrate vacuum inlet channels and one or more base-plate inlet channels. In another embodiment, the apparatus includes a detachable plate configured for reversible attachment to the base of the chuck. In another embodiment, the detachable plate includes one or more first vacuum reservoirs on a backside portion of the detachable plate and one or more second vacuum reservoirs on a frontside portion of the detachable plate. In another embodiment, the detachable plate is configured to establish fluidic connection between the one or more first vacuum reservoirs on the backside portion of the detachable plate and the one or more base-plate inlet channels for forming a first vacuum seal between the detachable plate and the base. In another embodiment, the detachable plate includes one or more pass-through channels for fluidic connection with the one or more base-substrate vacuum inlet channels to establish fluidic connection between the one or more second vacuum reservoirs on the frontside portion of the detachable plate for forming a second vacuum seal between the detachable plate and the substrate.

An optical system is disclosed, in accordance with one or more embodiments of the present disclosure. In one embodiment, the optical system includes a substrate chucking sub-system. In another embodiment, the optical system includes an illumination source configured to illuminate one or more portions of the substrate secured by the substrate chucking sub-system. In another embodiment, the optical system includes a detector configured to collect illumination from the illuminated one or more portions of the substrate. In one embodiment, the substrate chucking sub-system includes a base. In another embodiment, the base includes one or more base-substrate vacuum inlet channels and one or more base-plate inlet channels. In another embodiment, the substrate chucking sub-system includes a detachable plate configured for reversible attachment to the base. In another embodiment, the detachable plate further includes one or more first vacuum reservoirs on a backside portion of the detachable plate and one or more second vacuum reservoirs on a frontside portion of the detachable plate. In another embodiment, the detachable plate is configured to establish fluidic connection between the one or more first vacuum reservoirs on the backside portion of the detachable plate and the one or more base-plate inlet channels for forming a first vacuum seal between the detachable plate and the base. In another embodiment, the detachable plate includes one or more pass-through channels for fluidic connection with the one or more base-substrate vacuum inlet channels to establish fluidic connection between the one or more second vacuum reservoirs on the frontside portion of the detachable plate for forming a second vacuum seal between the detachable plate and the substrate.

A method is disclosed, in accordance with one or more embodiments of the present disclosure. In one embodiment, the method receiving a detachable plate including one or more first vacuum reservoirs on a backside portion of the detachable plate and one or more second vacuum reservoirs on a frontside portion of the detachable plate. In another embodiment, the method includes securing the detachable plate to a base of a chuck by establishing fluidic connection between the one or more first vacuum reservoirs on the backside portion of the detachable plate and the one or more base-plate inlet channels to form a first vacuum seal between the detachable plate and the base. In another embodiment, the method includes receiving a substrate. In another embodiment, the method includes securing the substrate to the detachable plate by establishing fluidic connection, via one or more pass-through channels, between the one or more base-substrate vacuum inlet channels and the one or more second vacuum reservoirs on the frontside portion of the detachable plate to form a second vacuum seal between the detachable plate and the substrate.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Referring generally to FIGS. 1A through 3, a system and method for a substrate-chucking system is described, in accordance with one or more embodiments of the present disclosure.

Embodiments of the present disclosure are directed to a substrate-chucking system with a vacuum-secured, detachable top plate suitable for quick interchange on a chuck base. Such a configuration is more time and cost efficient in the substrate chuck interchanging process, as it allows for a common chuck base to accommodate multiple top plates used for a variety of substrates. It is further noted that the substrate chucking system may be implemented in a variety of optical systems, such as, but not limited to, inspection systems, metrology systems, and lithography systems.

Figure 1A:
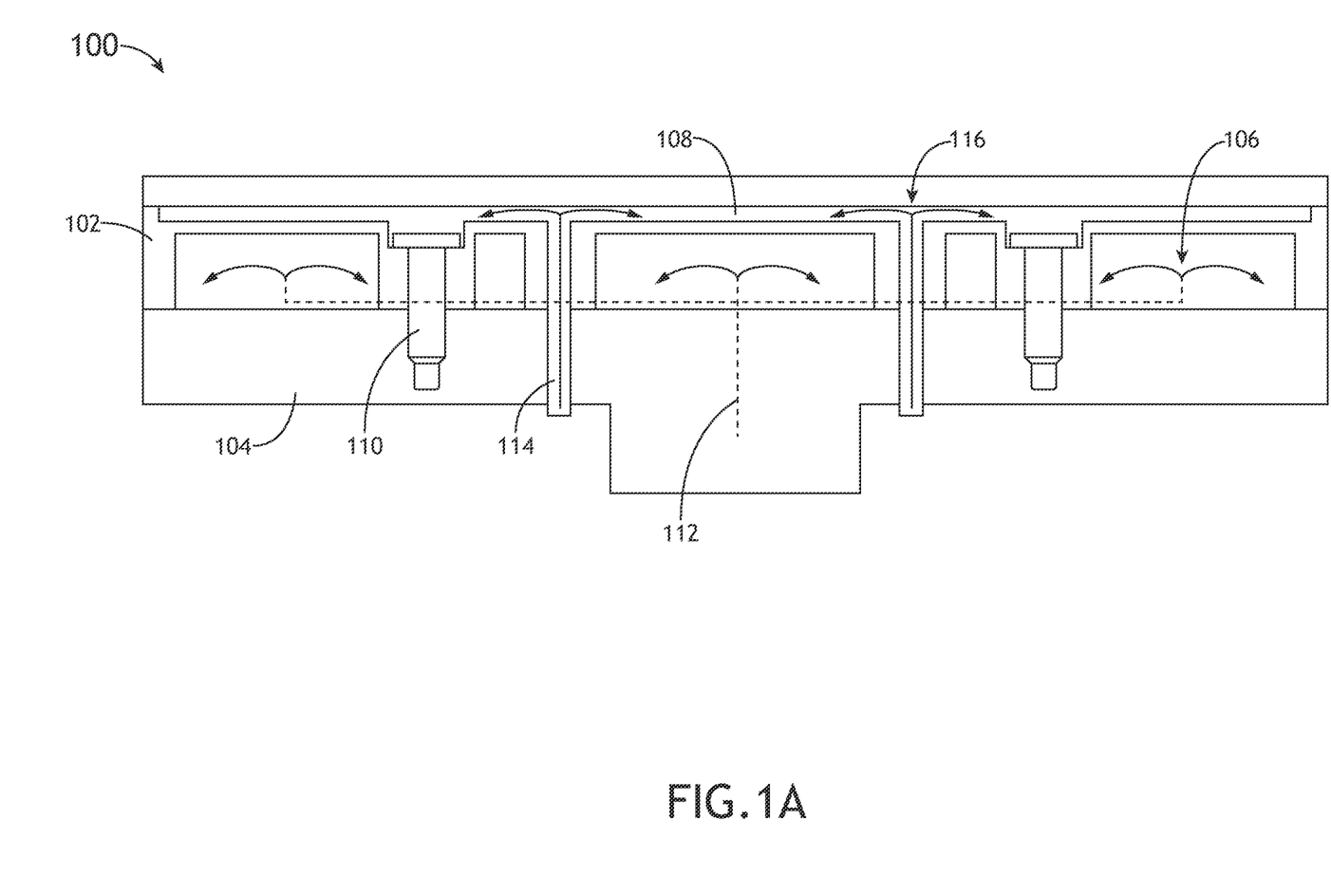
FIG. 1A illustrates a cross-sectional view of a substrate chucking sub-system, in accordance with one or more embodiments of the present disclosure.
Figure 1B:
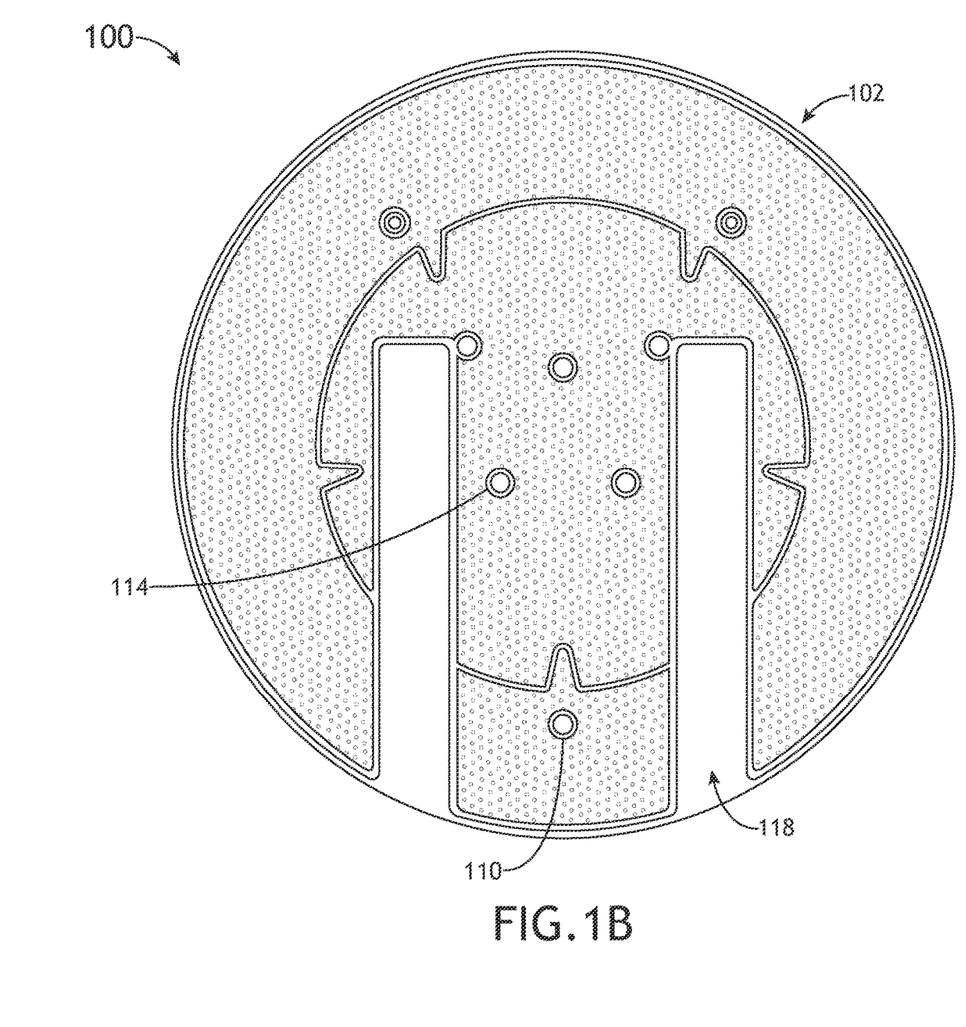
FIG. 1B illustrates a top view of a substrate chucking sub-system, in accordance with one or more embodiments of the present disclosure.

FIG. 1A illustrates a cross-sectional view of a substrate chucking sub-system 100 and FIG. 1B illustrates a top view of the chucking sub-system 100, in accordance with one or more embodiments of the present disclosure. In embodiments, as illustrated by FIG. 1B, the chucking sub-system 100 may include one or more end effector slots 118. In embodiments, the substrate chucking sub-system 100 includes a chuck base 104, a detachable plate 102, one or more upper vacuum inlets 114, one or more lower vacuum inlets 112, an upper vacuum reservoir 108, one or more lower vacuum reservoirs 106, and one or more fasteners 110 for securing a substrate 116 to the detachable plate 102. In embodiments, chuck base 104 may be mechanically coupled to a rotational drive unit. For example, chuck base 104 may be coupled to a rotational drive unit, wherein the rotational drive unit is configured to rotate the chuck base 104, the detachable plate 102, and the substrate 116 during an optical system process (e.g., inspection, metrology, and lithography).

In embodiments, as illustrated in FIGS. 1A and 1B, the detachable plate 102 includes one or more lower vacuum reservoirs located on the bottom side portion of the detachable plate 102 and on the top side portion of chuck base 104. In this regard, the detachable plate 102 is attached to the chuck base 104 using the one or more lower vacuum reservoirs 106. For example, during operation, a fluidic connection may be established between one or more lower vacuum inlets 112 and one or more lower vacuum reservoirs 106 to create a vacuum seal between detachable plate 102 and chuck base 104. In this regard, the vacuum seal established using the one or more lower vacuum reservoirs 106 and the one or more lower vacuum inlets 112 serves to provide a downward force on detachable plate 102, sealing and holding the bottom side of detachable plate 102 to the top side of chuck base 104.

In embodiments, detachable plate 102 may be secured to chuck base 104 using one or more fasteners 110. The one or more fasteners 110 may include any fastening elements known in the art, including, but not limited to, screws, bolts, and pins. In embodiments, detachable plate 102 may be formed from materials including, but not limited to, of polyetheretherketone polymer, carbon fiber, or silicon carbide. In embodiments, detachable plate 102 may be coated with one or more coatings. For example, detachable plate 102 may be coated with one or more layers of anti-reflective coating.

In embodiments, the detachable plate 102 includes one or more top vacuum reservoirs 108. In this regard, substrate 116 (e.g., a semiconductor wafer) may be attached to the detachable plate 102 using the one or more top vacuum reservoirs 108, which are located on the bottom side of substrate 116 and on the top side of detachable plate 102. For example, a fluidic connection may be established between one or more upper vacuum inlets 114 and one or more upper vacuum reservoirs 108 to create a vacuum seal between detachable plate 102 and substrate 116. In this regard, the vacuum seal established using the one or more upper vacuum reservoirs 108 and the one or more upper vacuum inlets 114 serves to provide a downward force on substrate 116, sealing and holding the bottom side of substrate 116 to the top side of detachable plate 102.

Figure 2A:
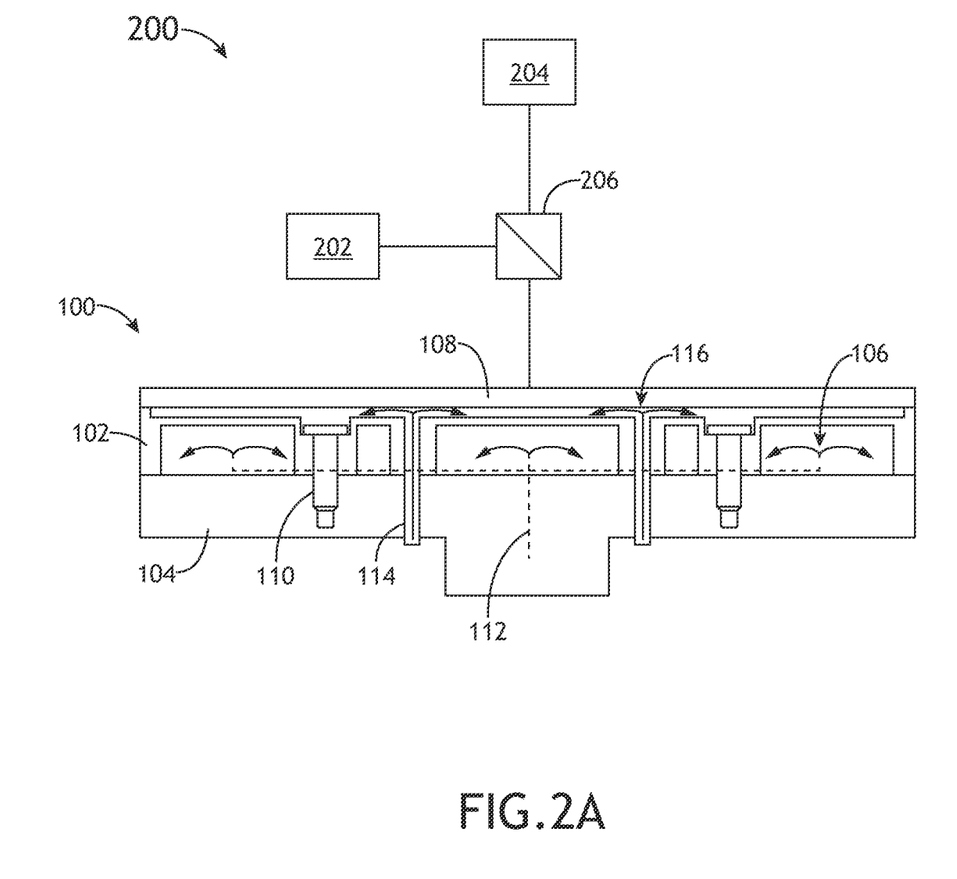
FIGS. 2A and 2B illustrate simplified schematic views optical systems equipped with a substrate chucking sub-system, in accordance with one or more embodiments of the present disclosure.
Figure 2B:
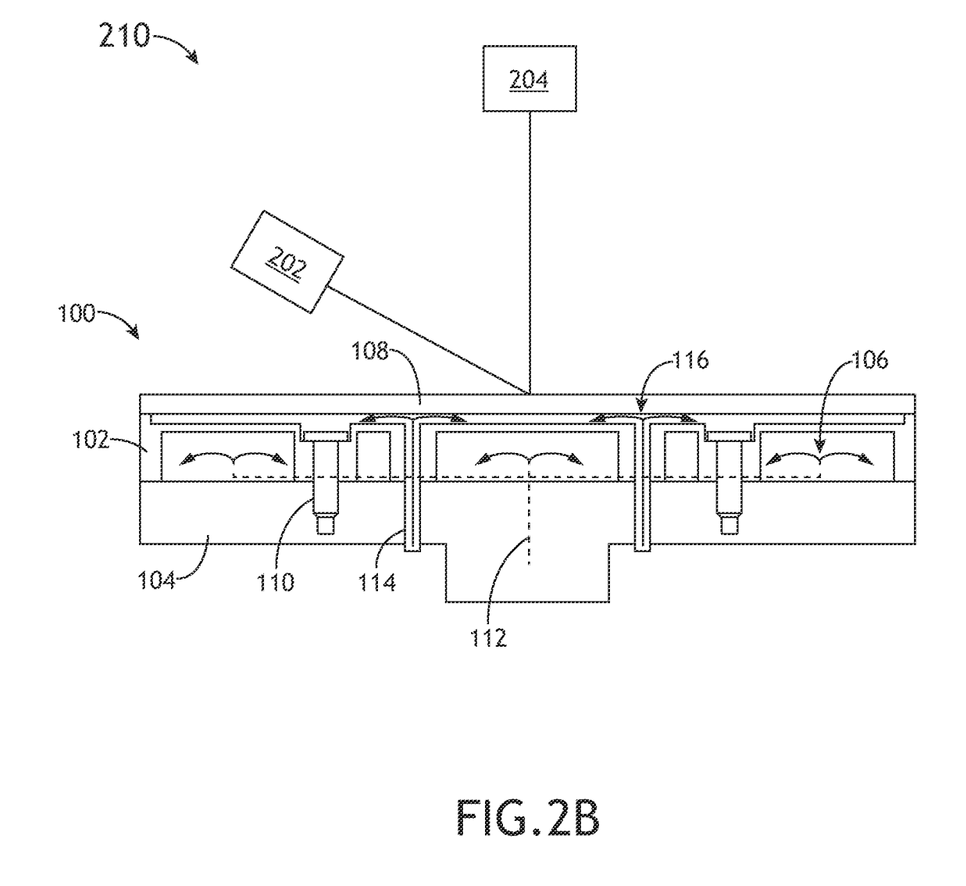

FIGS. 2A and 2B illustrate simplified schematic views of optical systems equipped with a wafer chucking subsystem with an interchangeable plate, in accordance with one or more embodiments of the present disclosure. In embodiments, the optical systems 200, 210 of the present disclosure may include the substrate chucking sub-system 100, as described previously herein. In one embodiment, the optical systems 200, 210 further include least one light source 202 (e.g., one or more lasers, one or more broadband light sources, etc.) configured to illuminate an area on the surface of the substrate 116. In another embodiment, the optical systems 200, 210 include one or more detectors 204, or cameras, suitable for detecting light reflected, diffracted, or scattered from the area illuminated by the light source 202. In one embodiment, the one or more detectors 204 may include, but are not limited to, a CCD or TDI-CCD detector, or a photomultiplier detector. In addition, the optical systems 200, 210 may include a set of optical elements (e.g., illumination optics, collection optics, beam splitters 206, filters and the like) configured for directing (and focusing) illumination from the light source 202 onto the surface of the substrate 116 and, in turn, directing illumination from the surface of the substrate 116 to the imaging portion of the detector 204 of the optical systems 200, 210. For instance, the set of optical elements for the optical systems 200, 210 may include, but is not limited to, a primary imaging lens suitable for imaging the illuminated area of the substrate onto a collection portion(s) of the detector 204. Further, the imaging detector 204 may be communicatively coupled to an image processing computer which may identify and store imagery data acquired from the detector 204.

The optical systems 200, 210 of the present disclosure may be configured as any optical systems known in the art, including, but not limited to inspection systems, metrology systems, and lithography systems. For example, as shown in FIG. 2A, the optical system 200 of the present invention may be configured as a bright field (BF) inspection system. Alternatively, as shown in FIG. 2B, the optical system 210 may be configured as a dark field (DF) inspection system. Applicant notes that the optical configurations depicted in FIGS. 2A and 2B are provided merely for illustrative purposes and should not be interpreted as limiting. In a general sense, the optical systems 200, 210 of the present disclosure may include any set of imaging and optical elements suitable for imaging the surface of the substrate 116. Examples of wafer inspection tools are described in detail in U.S. Pat. Nos. 7,092,082, 6,702,302, 6,621,570 and 5,805,278, which are each herein incorporated by reference.

Figure 3:
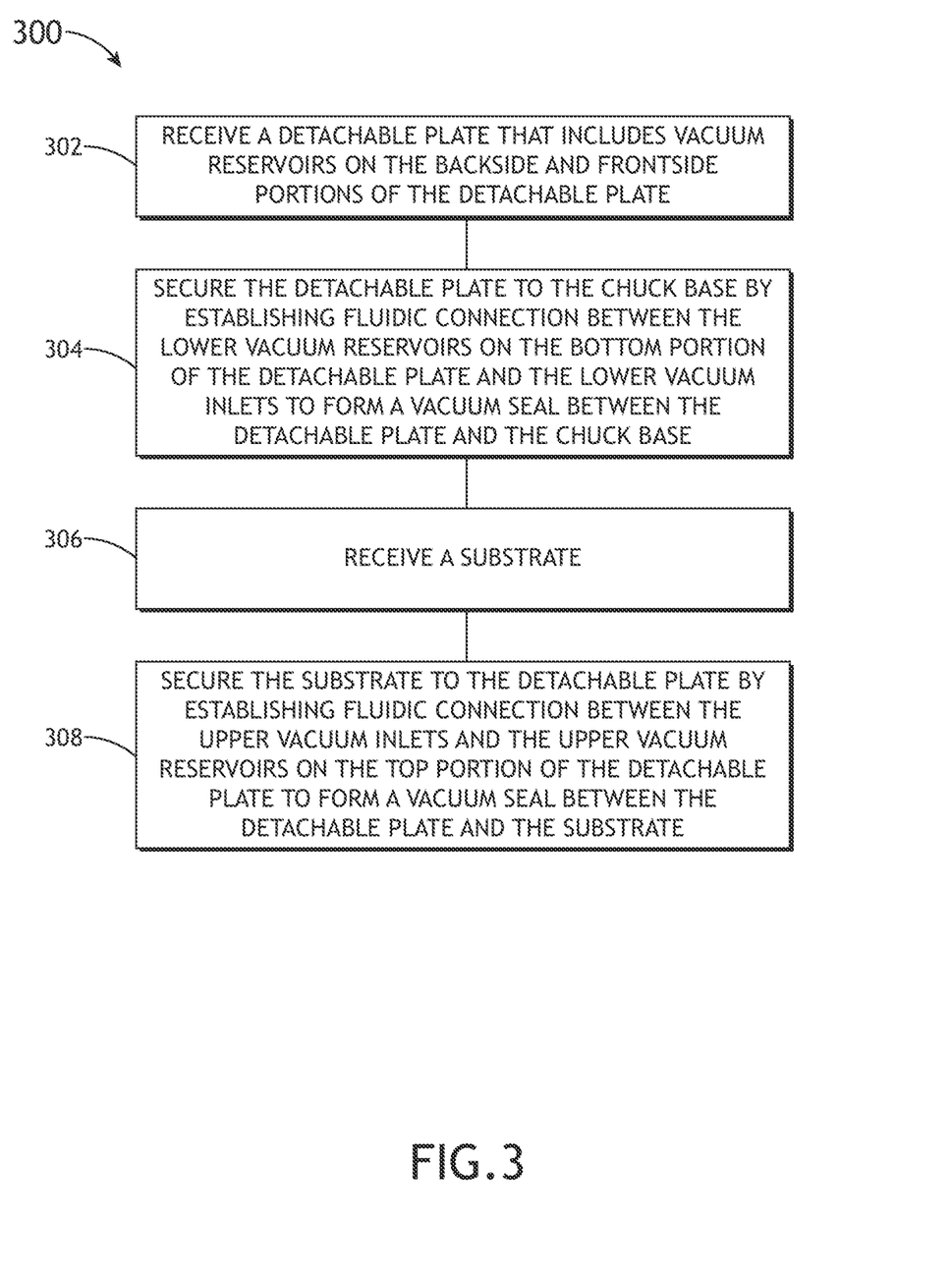
FIG. 3 illustrates a flowchart of a method for chucking of a substrate, in accordance with one or more embodiments of the present disclosure.

FIG. 3 illustrates a flowchart of a method 300 for chucking of a wafer using an interchangeable wafer plate, in accordance with one or more embodiments of the present disclosure. It is noted herein that the steps of method 300 may be implemented all or in part by sub-system 100. It is further recognized, however, that the method 300 is not limited to the sub-system 100 in that additional or alternative system-level embodiments may carry out all or part of the steps of method 300.

In a step 302, a detachable plate is received, wherein the detachable plate includes vacuum reservoirs on the bottom and top portions of the detachable plate. For example, as illustrated in FIGS. 1A and 1B, detachable plate 102 may include one or more upper vacuum reservoirs 108 on the top portion of detachable plate 102 and one or more lower vacuum reservoirs 106 on the bottom portion of detachable plate 102.

In a step 304, the detachable plate is secured to the chuck base by establishing fluidic connection between the lower vacuum reservoirs on the bottom portion of the detachable plate and the lower vacuum inlets to form a vacuum seal between the detachable plate and the chuck base. For example, as illustrated by FIGS. 1A and 1B, a fluidic connection may be established between one or more lower vacuum inlets 112 and one or more lower vacuum reservoirs 106 to create a vacuum seal between detachable plate 102 and chuck base 104. In this regard, the vacuum seal established using the one or more lower vacuum reservoirs 106 and the one or more lower vacuum inlets 112 serves to provide a downward force on detachable plate 102, sealing and holding the bottom side of detachable plate 102 to the top side of chuck base 104.

In a step 306, a substrate is received. For example, a semiconductor wafer, a transparent glass wafer, or the like may be received.

In a step 308, the substrate is secured to the detachable plate by establishing fluidic connection between the upper vacuum inlets and the upper vacuum reservoirs on the top portion of the detachable plate to form a vacuum seal between the top portion of the detachable plate and the lower portion of the substrate. For example, as illustrated in FIGS. 1A and 1B, a fluidic connection may be established between one or more upper vacuum inlets 114 and one or more upper vacuum reservoirs 108 to create a vacuum seal between detachable plate 102 and substrate 116. In this regard, the vacuum seal established using the one or more upper vacuum reservoirs 108 and the one or more upper vacuum inlets 114 serves to provide a downward force on substrate 116, sealing and holding the bottom side of substrate 116 to the top side of detachable plate 102.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be affected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be affected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus for securing a substrate comprising:
   a detachable plate, wherein the detachable plate is configured for reversible attachment to a base of a chuck, wherein the detachable plate includes one or more first vacuum reservoirs on a backside portion of the detachable plate and one or more second vacuum reservoirs on a frontside portion of the detachable plate,
   wherein the base includes one or more base-substrate vacuum inlet channels and one or more base-plate inlet channels,
   wherein the detachable plate is configured to establish fluidic connection between the one or more first vacuum reservoirs on the backside portion of the detachable plate and the one or more base-plate inlet channels for forming a first vacuum seal between the detachable plate and the base; and
   wherein the detachable plate includes one or more pass-through channels for fluidic connection with the one or more base-substrate vacuum inlet channels to establish fluidic connection between the one or more second vacuum reservoirs on the frontside portion of the detachable plate for forming a second vacuum seal between the detachable plate and the substrate.

2. The apparatus of claim 1, wherein the detachable plate is secured to the base via one or more fasteners.

3. The apparatus of claim 2, wherein the one or more fasteners comprise at least one of one or more screws, one or more bolts, or one or more pins.

4. The apparatus of claim 1, wherein the detachable plate is secured to the base via the first vacuum seal between the detachable plate and the base.

5. The apparatus of claim 1, wherein the detachable plate is coated with one or more coatings.

6. The apparatus of claim 5, wherein the one or more coatings comprise one or more anti-reflective coatings.

7. The apparatus of claim 1, wherein at least a portion of the detachable plate is formed from at least one of polyetheretherketone polymer, carbon fiber, or silicon carbide.

8. The apparatus of claim 1, wherein the base of the chuck is mechanically coupled to a rotational drive unit, wherein the rotational drive unit comprises:
a spindle; and
a motor.

9. The apparatus of claim 1, wherein the comprises:
a semiconductor wafer.

10. An apparatus for securing a substrate comprising:
a base of a chuck;
a detachable plate, wherein the detachable plate is configured for reversible attachment to the base of the chuck, wherein the detachable plate includes one or more first vacuum reservoirs on a backside portion of the detachable plate and one or more second vacuum reservoirs on a frontside portion of the detachable plate,
wherein the base includes one or more base-substrate vacuum inlet channels and one or more base-plate inlet channels,
wherein the detachable plate is configured to establish fluidic connection between the one or more first vacuum reservoirs on the backside portion of the detachable plate and the one or more base-plate inlet channels for forming a first vacuum seal between the detachable plate and the base; and
wherein the detachable plate includes one or more pass-through channels for fluidic connection with the one or more base-substrate vacuum inlet channels to establish fluidic connection between the one or more second vacuum reservoirs on the frontside portion of the detachable plate for forming a second vacuum seal between the detachable plate and the substrate.

11. An optical system comprising:
a substrate chucking sub-system including:
a base;
a detachable plate, wherein the detachable plate is configured for reversible attachment to the base, wherein the detachable plate includes one or more first vacuum reservoirs on a backside portion of the detachable plate and one or more second vacuum reservoirs on a frontside portion of the detachable plate;
wherein the base includes one or more base-substrate vacuum inlet channels and one or more base-plate inlet channels;
wherein the detachable plate is configured to establish fluidic connection between the one or more first vacuum reservoirs on the backside portion of the detachable plate and the one or more base-plate inlet channels for forming a first vacuum seal between the detachable plate and the base; and
wherein the detachable plate includes one or more pass-through channels for fluidic connection with the one or more base-substrate vacuum inlet channels to establish fluidic connection between the one or more second vacuum reservoirs on the frontside portion of the detachable plate for forming a second vacuum seal between the detachable plate and the substrate; and
an illumination source configured to illuminate one or more portions of the substrate secured by the substrate chucking sub-system; and
a detector configured to collect illumination from the illuminated one or more portions of the substrate.

12. The optical system of claim 11, wherein the optical system is configured as an inspection tool.

13. The optical system of claim 11, wherein the optical system is configured as a metrology tool.

14. The optical system of claim 11, herein the detachable plate is secured to the base via one or more fasteners.

15. The optical system of claim 14, herein the one or more fasteners comprise at least one of one or more screws, one or more bolts, or one or more pins.

16. The optical system of claim 11, wherein the detachable plate is secured to the base via the first vacuum seal between the detachable plate and the base.

17. The optical system of claim 11, wherein the detachable plate is coated with one or more coatings.

18. The optical system of claim 17, wherein the one or more coatings comprise one or more anti-reflective coatings.

19. The optical system of claim 11, wherein at least a portion of the detachable plate is formed from at least one of polyetheretherketone polymer, carbon fiber, or silicon carbide.

20. The optical system of claim 11, wherein the base is mechanically coupled to a rotational drive unit, wherein the rotational drive unit comprises:
a spindle; and
a motor.

21. The optical system of claim 11, wherein the substrate comprises:
a semiconductor wafer.

22. A method comprising:
receiving a detachable plate including one or more first vacuum reservoirs on a backside portion of the detachable plate and one or more second vacuum reservoirs on a frontside portion of the detachable plate;
securing the detachable plate to a base of a chuck by establishing fluidic connection between the one or more first vacuum reservoirs on the backside portion of the detachable plate and one or more base-plate inlet channels to form a first vacuum seal between the detachable plate and the base;
receiving a substrate; and
securing the substrate to the detachable plate by establishing fluidic connection, via one or more pass-through channels, between the one or more base-substrate vacuum inlet channels and the one or more second vacuum reservoirs on the frontside portion of the detachable plate to form a second vacuum seal between the detachable plate and the substrate.

* * * * *

UNITED STATES PATENT AND TRADEMARK OFFICE
CERTIFICATE OF CORRECTION

PATENT NO. : 11,794,314 B2
APPLICATION NO. : 17/562544
DATED : October 24, 2023
INVENTOR(S) : Lim Chow Tian, Rajeev Patil and Harit Maganlal Gadhia It is certified that error appears in the above-identified patent and that said Letters Patent is hereby corrected as shown below:

In the Claims

Column 9, Claim 9, Lines 20-21 should read:
9. The apparatus of claim 1, wherein the substrate comprises:
a semiconductor wafer.

Column 10, Claim 14, Lines 20-21 should read:
14. The optical system of claim 11, wherein the detachable plate is secured to the base via one or more fasteners.

Column 10, Claim 15, Lines 22-24 should read:
15. The optical system of claim 14, wherein the one or more fasteners comprise at least one of one or more screws, one or more bolts, or one or more pins.

Signed and Sealed this
Ninth Day of July, 2024

Katherine Kelly Vidal
*Director of the United States Patent and Trademark Office*